(12) United States Patent
Willmeroth et al.

(10) Patent No.: US 9,385,119 B2
(45) Date of Patent: Jul. 5, 2016

(54) SEMICONDUCTOR ARRANGEMENT WITH A LOAD, A SENSE AND A START-UP TRANSISTOR

(71) Applicant: Infineon Technologies AG, Neubiberg (DE)

(72) Inventors: Armin Willmeroth, Augsburg (DE); Marc Fahlenkamp, Geretsried (DE)

(73) Assignee: Infineon Technologies AG, Neubiberg (DE)

( * ) Notice: Subject to any disclaimer, the term of this patent is extended or adjusted under 35 U.S.C. 154(b) by 147 days.

(21) Appl. No.: 13/774,492

(22) Filed: Feb. 22, 2013

(65) Prior Publication Data

US 2014/0070323 A1   Mar. 13, 2014

Related U.S. Application Data

(62) Division of application No. 12/818,381, filed on Jun. 18, 2010, now Pat. No. 8,411,471.

(51) Int. Cl.
*H01L 27/088* (2006.01)
*H02M 1/36* (2007.01)

(52) U.S. Cl.
CPC .............. *H01L 27/088* (2013.01); *H02M 1/36* (2013.01)

(58) Field of Classification Search
USPC ........................................................ 257/368
See application file for complete search history.

(56) References Cited

U.S. PATENT DOCUMENTS

| 5,854,742 | A | 12/1998 | Faulk | |
|---|---|---|---|---|
| 6,940,126 | B2 | 9/2005 | Deboy et al. | |
| 7,826,238 | B2 | 11/2010 | Halamik et al. | |
| 2008/0283913 | A1* | 11/2008 | Shibata | 257/341 |
| 2010/0078708 | A1* | 4/2010 | Willmeroth et al. | 257/328 |
| 2010/0148276 | A1 | 6/2010 | Uhlig et al. | |

FOREIGN PATENT DOCUMENTS

DE        10240861 B4     8/2007

\* cited by examiner

*Primary Examiner* — Tran Tran
(74) *Attorney, Agent, or Firm* — Murphy, Bilak & Homiller, PLLC

(57) ABSTRACT

A semiconductor arrangement includes a semiconductor body with a first active region, a second active region and an isolation region arranged between the first and the second active regions. At least one source region and at least one body region of a first transistor are integrated in the first active region. At least one source region and at least one body region of a second transistor are integrated in the second active region. Source and body regions of a third transistor are integrated in the second active region. The second transistor and the third transistor have a common source electrode. The first transistor, the second transistor and the third transistor have a common drain electrode.

15 Claims, 6 Drawing Sheets

SEMICONDUCTOR ARRANGEMENT WITH A LOAD, A SENSE AND A START-UP TRANSISTOR

PRIORITY CLAIM

This application is a Divisional of U.S. application Ser. No. 12/818,381, filed on Jun. 18, 2010, the content of said application incorporated herein by reference in its entirety.

TECHNICAL FIELD

The present invention relates to an electronic circuit with a load transistor, a sense transistor and a start-up transistor, and to a semiconductor arrangement with a first transistor, a second transistor and a third transistor.

BACKGROUND

Transistors, such as bipolar transistors, MOSFET or IGBT, are widely used as switches for switching electric loads, such as electric motors or electric lighting, or as switches for generating an oscillating voltage from a DC input voltage in a switched-mode power supply. In those applications it is often required to measure a current through the transistor.

MOS-Transistors are voltage-controlled components that can be switched on and off using a drive voltage which is, for example, in the range of several volts, while—depending on their specification—they are capable of switching load voltages of up to several hundred volts. Usually a drive voltage for a transistor is provided by a drive circuit that receives a supply voltage which is high enough for the drive circuit to generate the drive voltage. In some applications, such as, for example, some types of switched-mode power supplies, the supply voltage is generated when the load transistor is cyclically switched on and off. In these cases, however, a start-up circuit is required that provides the supply voltage before the load transistor is switched on for the first time.

There is, therefore, a need for providing an electronic circuit with a load transistor that has a current sense and a start-up capability.

SUMMARY

A first aspect relates to an electronic circuit including a first load terminal, a second load terminal, and a supply terminal, the supply terminal being configured for having a charge storage arrangement connected thereto. The electronic circuit further includes: a load transistor having a control terminal and a load path, wherein the load path is coupled between the first load terminal and the second load terminal; a current sense circuit configured to provide a current sense signal and comprising a sense transistor and an activation input. The sense transistor has a control terminal and a load path, wherein the control terminal is coupled with the control terminal of the load transistor. Further, a start-up circuit includes a start-up transistor and a deactivation input, the start-up transistor has a control terminal and a load path, the load path of the start-up transistor is coupled between the first load terminal and the supply terminal, and the start-up transistor and the sense transistor have their load paths connected in parallel. A drive circuit includes a supply input coupled to the supply terminal, and a drive output coupled with the control terminal of the load transistor. Further, the electronic circuit includes a control circuit having an input terminal coupled with the supply terminal and being configured to deactivate the start-up circuit via the deactivation input dependent on a supply voltage at the supply terminal and to activate the current sense circuit via the activation input at least dependent on the supply voltage at the supply terminal.

A second aspect relates to a switched-mode power supply including a first load terminal, a second load terminal, and a supply terminal configured for having a charge storage arrangement connected thereto. The electronic circuit further includes a load transistor having a control terminal and a load path, wherein the load path is coupled between the first load terminal and the second load terminal, a current sense circuit configured to provide a current sense signal and comprising a sense transistor and an activation input. The sense transistor has a control terminal and a load path, wherein the control terminal is coupled with the control terminal of the load transistor. Further, a start-up circuit includes a start-up transistor and a deactivation input, the start-up transistor has a control terminal and a load path, the load path of the start-up transistor is coupled between the first load terminal and the supply terminal, and the start-up transistor and the sense transistor have their load paths connected in parallel. A drive circuit includes a supply input coupled to the supply terminal, and a drive output coupled with the control terminal of the load transistor. Further, the electronic circuit includes a control circuit having an input terminal coupled with the supply terminal and being configured to deactivate the start-up circuit via the deactivation input dependent on a supply voltage at the supply terminal and to activate the current sense circuit via the activation input at least dependent on the supply voltage at the supply terminal. The power supply further includes: a transformer with a primary winding connected in series with the load path of the load transistor, and with a secondary winding; a rectifier circuit connected with the secondary winding and configured to provide an output voltage; and a feedback-circuit configured to receive the output voltage and to provide a feedback signal dependent on the output voltage. The drive circuit is configured to receive the feedback signal and the current sense signal.

A third aspect relates to a semiconductor arrangement, including a semiconductor body with a first active region, a second active region and an isolation region arranged between the first and the second active regions. The semiconductor arrangement further includes at least one source region and at least one body region of a first transistor integrated in the first active region, at least one source region and at least one body region of a second transistor integrated in the second active region, and at least one source region and at least one body region of a third transistor integrated in the second active region. The first transistor and the second transistor have a common first gate electrode and the second transistor and the third transistor have a common source electrode. The first transistor, the second transistor and the third transistor have a common drain electrode.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like signals and circuit components.

DETAILED DESCRIPTION OF THE DRAWINGS

Figure 1:
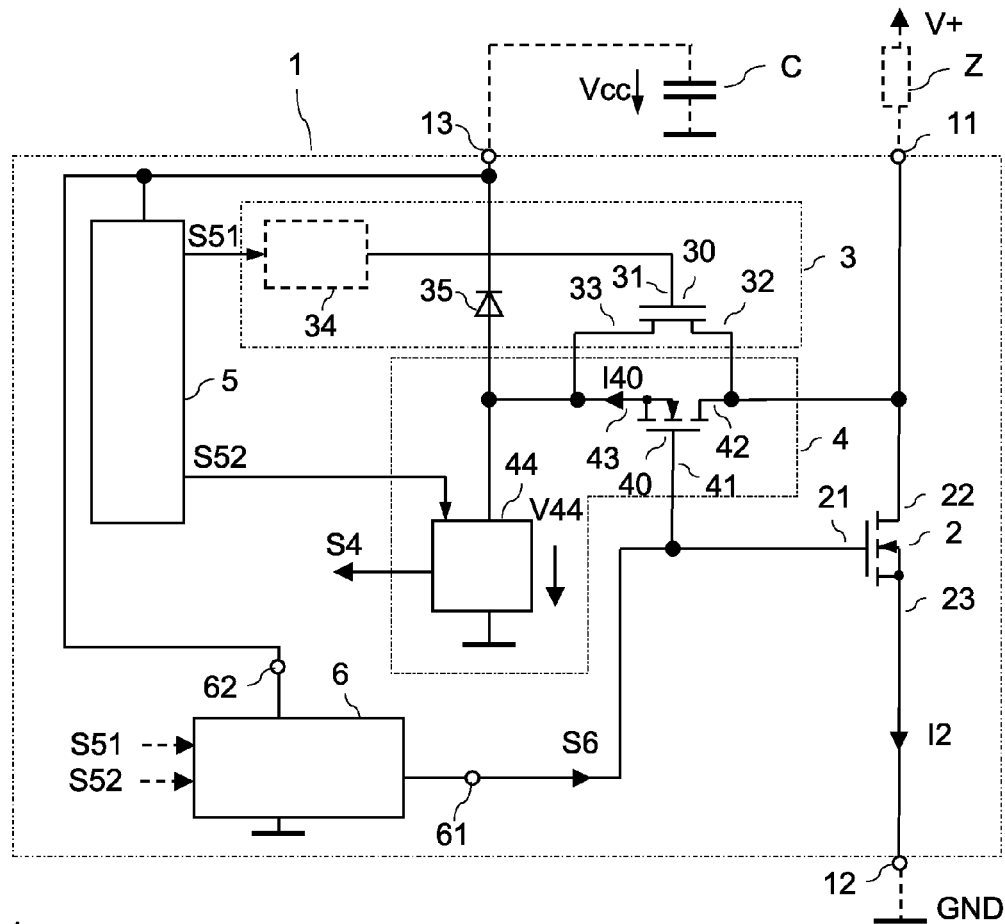
FIG. 1 schematically illustrates a first embodiment of an electronic circuit with a load transistor, a current sense circuit and a start-up circuit.

FIG. 1 schematically illustrates a first embodiment of an electronic circuit 1, in particular an electronic circuit 1 for switching an electrical load Z (illustrated in dashed lines). The electronic circuit 1 includes a first load terminal 11 and a second load terminal 12. These first and second load terminals 11, 12 are configured to be connected in series with the load Z, and the series circuit with the electronic circuit 1 and the load Z is configured to be connected between terminals for a positive supply potential V+ and a negative supply potential or reference potential GND. The connection of the series circuit between the supply terminals is also illustrated in dashed lines in FIG. 1. In the embodiment illustrated in FIG. 1 the electronic circuit 1 and the load Z are connected in a low-side configuration, which means that the electronic circuit 1 via the first and second load terminals 11, 12 is connected between the load Z and the negative supply potential or reference potential GND. This, however, is only an example. The electronic circuit 1 could also be connected in a high-side configuration. In this case the electronic circuit 1 would be connected between the load Z and the positive supply potential V+.

The electronic circuit 1 includes a load transistor 2 with a control terminal 21 and a load path between a first load terminal 22 and a second load terminal 23 of the load transistor. The load path of the load transistor 21 is coupled between the first and the second load terminals 11, 12 of the electronic circuit 1. For this purpose the first load terminal 22 of the load transistor 2 is coupled to the first load terminal 11 of the electronic circuit 1, and the second load terminal 23 of the load transistor 2 is coupled to the second load terminal 12 of the electronic circuit. In the embodiment illustrated in FIG. 1 the load terminals 22, 23 of the load transistor 2 are directly connected to the load terminals 11, 12 of the electronic circuit 1. This, however, is only an example. It should be mentioned, that additional components (not illustrated) can be connected between each of the load terminals 22, 23 of the load transistor 2 and the first and the second load terminals 11, 12.

The load transistor 2 is configured to be switched on and off dependent on a drive signal S6 received at its control terminal 21. A drive circuit 6 generates the drive signal S6 such that the drive signal S6 either assumes an on-level or an off-level. The load transistor 2 is switched on when the drive signal S6 assumes an on-level, and is switched off when the drive signal S6 assumes an off-level. The drive circuit includes an output terminal 61 at which the drive signal S6 is available and which is connected to the control terminal of the load transistor 2. The drive circuit 6 further includes a supply terminal 62 for receiving a supply voltage. The supply voltage is required in the drive circuit 6 in order to generate the drive signal S6, in particular in order to generate an on-level of the drive signal S6.

The electronic circuit 1 further includes a supply terminal 13. The supply terminal is configured for having a charge storage arrangement, like a capacitor C, connected thereto. A charge storage arrangement with a capacitor C is illustrated in dashed lines in FIG. 1. The charge storage arrangement C is configured for providing a supply voltage Vcc at the supply terminal 13. The drive circuit 6 has its supply terminal 62 connected to the supply terminal 13 of the electronic circuit 1 for receiving the supply voltage Vcc.

To charge the charge storage arrangement C the electronic circuit 1 includes a start-up circuit 3 with a start-up transistor 30. The start-up transistor 30 includes a control terminal 31 and a load path between a first load terminal 32 and a second load terminal 33 of the start-up transistor. The load path of the start-up transistor 30 is coupled between the first load terminal 11 and the supply terminal 13 of the electronic circuit 1. For this, the first load terminal 32 of the start-up transistor 30 is coupled to the first load terminal 11 of the electronic circuit 1, and the second load terminal 33 of the start-up transistor 30 is coupled to the supply terminal 13. Optionally, a rectifier element 35, like a diode, is connected in series with the load path of the start-up transistor 30 between the start-up transistor 30 and the supply terminal. The rectifier element 35 is configured to prevent a discharge current to flow from the supply terminal 13 into the start-up circuit 3 and a current sense circuit 4 which will be explained hereinbelow.

The current sense circuit 4 is configured to provide a current sense signal S4. The current sense circuit 4 includes a current sense transistor 40 having a control terminal 41 and load path between a first and a second load terminal 42, 43 of the current sense transistor. The load path of the current sense transistor 40 is connected in parallel with the load path of the start-up transistor 30, wherein the first load terminal 42 of the current sense transistor 40 is coupled to the first load terminal 11 of the electronic circuit 1. The control terminal 41 of the current sense transistor 40 is coupled to the control terminal 21 of the load transistor 2. An evaluation circuit 44 is connected in series with the load path of the current sense transistor 40, the evaluation circuit 44 generates the current sense signal S4.

The load transistor 2 and the current sense transistor 4 are transistors of the same transistor type. In the embodiment illustrated in FIG. 1 these transistors are enhancement MOSFET in particular n-type enhancement MOSFET. Gate terminals of these MOSFETs form the control terminals 21, 41, drain terminals form the first load terminals 22, 42, and source terminals form the second load terminals 23, 43. It should be noted that implementing the load transistor 2 and the current sense transistor 4 as n-type enhancement MOSFET is only an example. Any other type of MOSFET, like p-type enhancement MOSFET, an IGBT, or a bipolar transistor may be used as well.

The start-up transistor 30 is a depletion transistor, in particular an n-type depletion transistor in the embodiment illustrated in FIG. 1. Generally, the load transistor 2, the current sense transistor 40 and the start-up transistor 30 can be identical in terms of their conduction type, such as n-type.

The electronic circuit 1 further includes a control circuit 5 which is coupled to the supply terminal 13 and receives the supply voltage Vcc. The control circuit is configured to deactivate the start-up circuit 3 dependent on the supply voltage Vcc and to activate the current sense circuit 4 dependent on the supply voltage Vcc. The start-up circuit 3 includes a deactivation input configured to receive a deactivation signal S51 generated by the control circuit 5, and the current sense circuit 4 includes an activation input configured to receive an activation signal S52 generated by the control circuit 5.

The start-up circuit 3 is activated when the start-up transistor 30 is in a conducting state or on-state, and the start-up circuit 3 is deactivated when the start-up transistor 30 is in a blocking state or off-state. Thus, the start-up transistor 30 is switched into its blocking state or is switched off dependent on the deactivation signal S51. According to a first embodiment the control terminal 31 of the start-up transistor 30 receives the deactivation signal S51. Optionally, a deactivation circuit 34 is connected between the deactivation input of the start-up circuit 3 and the control terminal 31 of the start-up transistor 30. The deactivation circuit 34 is configured to switch the start-up transistor 30 off when the deactivation signal S51 assumes a deactivation level.

The activation signal S52 of the control circuit 5 is received by the evaluation circuit 44 of the current sense circuit 4. The evaluation circuit 44 is configured to provide the current sense signal S4 such that it is dependent on a current flowing through the current sense transistor 4 when the current sense circuit 4 is activated.

The operating principle of the electronic circuit 1 illustrated in FIG. 1 will be explained with reference to FIG. 2 in which timing diagrams of the load supply voltage V+, the supply voltage Vcc at the supply terminal 13, the deactivation signal S51, and the activation signal S52 are illustrated. For explanation purposes it is assumed that the second supply potential GND is ground. In this case the first supply potential V+ corresponds to the load supply voltage, which is the voltage between the first and the second supply terminals. For explanation purposes it is further assumed that this load supply voltage V+ is zero at the beginning and assumes a supply level at time t1. A "supply level" of the load supply voltage V+ is a voltage level that is sufficient for supplying the load Z when the load transistor 2 is switched on. This supply level, dependent on the type of the load Z, can be in the range of up to several hundred volts, like 400 V to 600 V. The load transistor 2, the start-up transistor 30 and the current sense transistor 40 are configured to have voltage-blocking capabilities that are suitable for blocking the load supply voltage V+.

For explanation purposes it is further assumed that the supply voltage Vcc at the supply terminal 13 is zero before time t1. Due to this, the drive circuit 6 cannot generate an on-level of the drive signal S6 before time t1. Thus, the load transistor 2 and the current sense transistor 4—that have their control terminals 41, 21 connected together—are in their blocking states (switched off) at time t1. Since generating the deactivation signal S51 by the control circuit 5 also requires a supply voltage Vcc other than zero, the start-up transistor 30 is automatically switched on at time t1 and before time t1. Thus, the start-up circuit 3 is automatically activated at time t1 when the load supply voltage V+ assumes its supply level. Starting with time t1 a charging current flows via the load Z, the first load terminal 11, the load path of the start-up transistor 30, the optional rectifier element 35 and the supply terminal 13 into the charge storage arrangement 10. Consequently the supply voltage Vcc increases beginning with time t1. At a time t2 the supply voltage Vcc reaches a threshold value. At this threshold value the supply voltage Vcc is sufficient or is more than sufficient for the drive circuit 6 to generate an on-level of the drive signal S6 and for the control circuit 5 to generate a deactivation level of the deactivation signal S51 and an activation level of the activation signal S52. When the supply voltage Vcc reaches the threshold value at time t2 the control circuit 5 generates a deactivation level of the deactivation signal S51 and, therefore, deactivates the start-up circuit 3 by switching the start-up transistor 30 off. Thus, there is no further increase in the supply voltage Vcc by virtue of a charging current flowing through the start-up transistor 30.

According to one embodiment, the threshold value is higher than a minimum supply voltage required for the drive circuit 6 to generate the drive signal S6 and the activation and deactivation signals S51, S52. The threshold voltage is, for example, in the range of between 10 V to 15 V, while the minimum supply voltage is, for example, in the range of between 5 V to 10 V. When the charge storage arrangement C is charged more than absolutely necessary, there is a safety margin that allows the supply voltage Vcc to drop to some extent without while the drive circuit 6 still functions properly. In this connection it should be mentioned that the start-up circuit is, in particular, used to charge the charge storage arrangement C only during system start-up, while a supply of the charge storage arrangement is provided by another supply circuit (not illustrated in FIG. 1) after start-up. The safety margin helps to ensure a proper function of the drive circuit between a time of deactivating the start-up circuit 6 and a time of activating the further supply circuit.

The control circuit 5 is configured to activate the current sense circuit 4 only when the start-up circuit 3 is deactivated. This prevents that a charging current flowing through the start-up transistor 30 flows into the evaluation circuit 44 instead of the charge storage arrangement C. The control circuit 5 can be configured to activate the current sense circuit 4 at the same time at which the start-up circuit 3 is deactivated. Optionally, there is a time delay between the deactivation of the start-up circuit 3 at time t2 and the activation of the current sense circuit 4 at a later time t3, as it is illustrated in FIG. 2. In the embodiment illustrated in FIG. 2 the deactivation level of the deactivation signal S51 is a high-level, and the activation level of the activation signal S52 is also a high-level. However, this is only an example. The deactivation level of the deactivation signal S51 can be any signal level that is suitable for deactivating start-up circuit 3, and the activation level of the activation signal S52 can be any signal level that is suitable for activating the current sense circuit 4.

Figure 2:
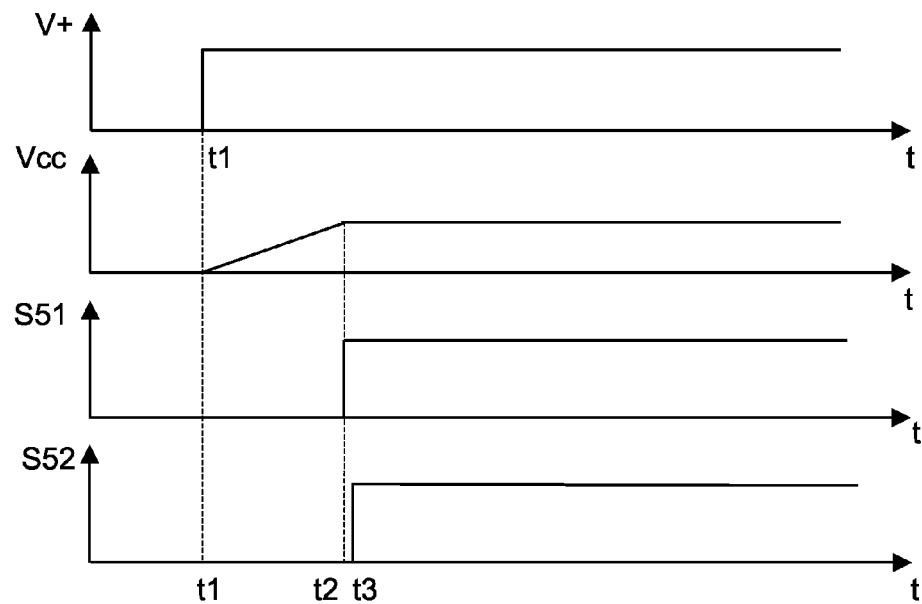
FIG. 2 schematically illustrates the operating principle of the electronic circuit of FIG. 1.

In the embodiment illustrated in FIG. 2 the current sense circuit 4 is kept activated after time t3, which is illustrated by the high-level of the activation signal S52 after time t3. However, this is only an example. After time t3 it is also possible to deactivate the current sense circuit temporarily during those time periods in which current sensing is not required. Thus, time t3 is the earliest time at which the current sense circuit 4 can be activated or is the time at which the current sense circuit is enabled to be activated.

If the load transistor 2 would be switched on when the start-up transistor 30 charges the charge storage arrangement C the charging process would be interrupted. In order to prevent the drive circuit 6 from switching the load transistor 2 on before the start-up circuit 3 is deactivated, the drive circuit 6 is either configured to generate an on-level of the drive signal S6 not before the supply voltage Vcc reaches the threshold value. Alternatively, the drive circuit 6 is configured to receive a control signal, like the deactivation signal S51 or the activation signal S52, that indicates that the supply voltage Vcc has reached the threshold value, and generates an on-level of the drive signal not before the control signal indicates that the start-up circuit 4 has been deactivated.

When the current sense circuit 4 is activated and when the drive signal S6 has an on-level, both the load transistor 2 and the current sense transistor 40 are switched on. In the embodiment illustrated in FIG. 2 the drive signal S6 corresponds to the gate potentials of the load transistor 2 and the current transistor 40. If the load transistor 2 and the current sense transistor 40 are operated in identical operation points or in almost identical operation points, then a sense current 140 flowing through the load path of the current sense transistor 40 is proportional or almost proportional to a load current 12 flowing through the load transistor 2. A proportionality factor between the sense current 140 and the load current 12 is given by the ratio between the active transistor areas of the sense transistor 40 and the load transistor 2. This ratio is, for example, in the range of between 1:1000 (1:E3) and 1:1000000 (1:E6). The operation points of the load transistor 2 and the current sense transistor 40 are almost identical when a voltage drop V44 across the evaluation circuit 44 is small compared to the amplitude of the on-level of the drive signal S6. However, especially when the load transistor is implemented as a power transistor, there can be a significant voltage drop at the source terminal 23, which results from resistance of bonding wires and a metalization (not shown in Figure). In those cases a voltage drop across the evaluation circuit 44 could be even advantageous. The amplitude of the on-level is, for example, between 8 V to 12 V, while the evaluation circuit 44 is, for example, configured to have a voltage drop of below 1 V, and, in particular, below 0.1 V. In this case the voltage drop across the evaluation circuit 44 is negligible so that the load current and the sense current can be considered to be proportional.

When the current sense circuit 4 is activated the evaluation circuit 44 generates the current sense signal S4 such that it is dependent on the sense current 140, wherein. The current sense signal S40 is, in particular, proportional to the sense current 140.

Figure 3:
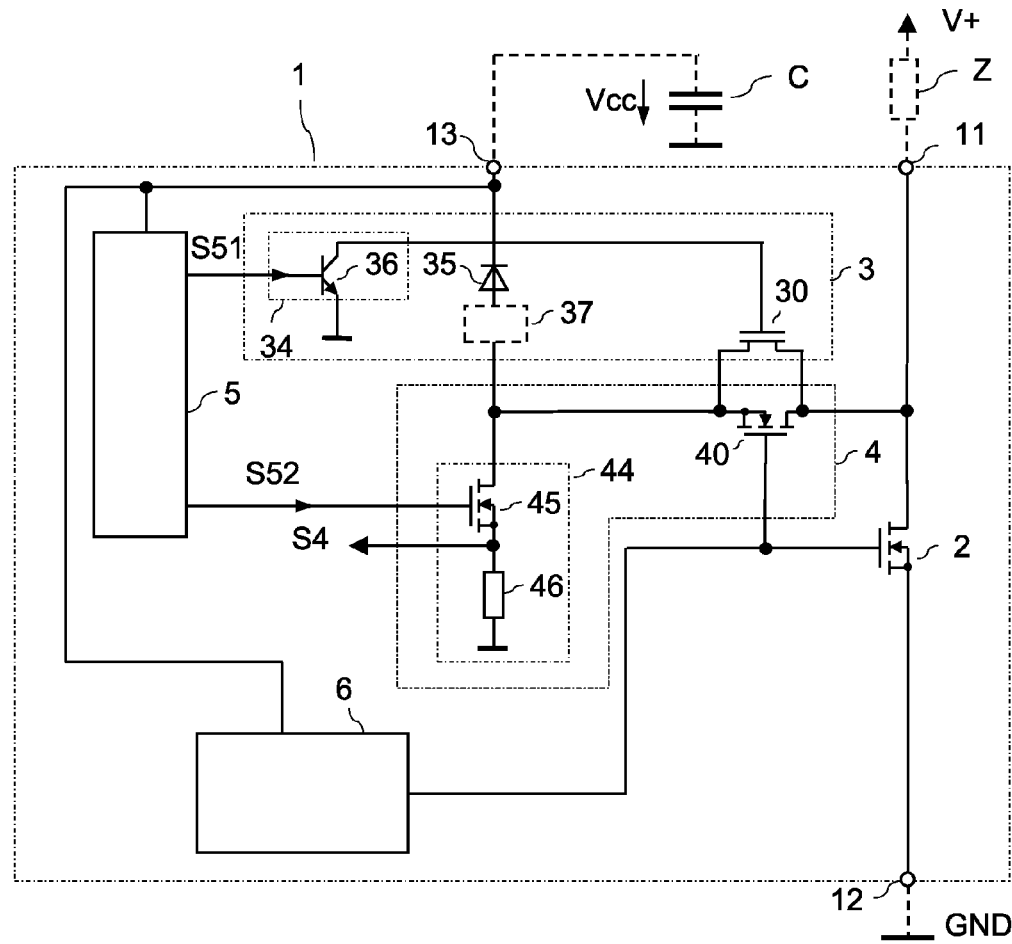
FIG. 3 illustrates more detailed embodiments of the start-up circuit and the current sense circuit.

FIG. 3 illustrates the electronic circuit of FIG. 1, wherein embodiments of the deactivation circuit 34 of the start-up circuit 3 and the evaluation circuit 44 of the current sense circuit 4 are illustrated in greater detail. Referring to FIG. 3, the deactivation circuit 34 includes a transistor, in particular a bipolar transistor, that has its load path (collector-emitter path) connected between the control terminal of the start-up transistor 30 and a reference potential. In the embodiment illustrated, the reference potential is the potential of the second load terminal (source terminal) of the load transistor 2, which is the second supply potential GND in the present embodiment. The transistor 36 of the deactivation circuit 34 receives the deactivation signal S51 at its control terminal (base terminal). In order to deactivate the start-up circuit 3 the control circuit 5 switches the transistor 36 on through the deactivation signal S51, so that the control terminal 31 of the depletion-type start-up transistor 30 is kept at the second supply potential GND. When the charge storage arrangement C has been charged, the second load terminal 32 (source terminal) of the start-up transistor 30 is approximately at the supply potential Vcc, so that the gate-source voltage of the start-up transistor 30 corresponds to the negative supply voltage −Vcc, so that the start-up transistor 30 is switched off. In this connection it should be mentioned that the depletion-type start-up transistor 30 has a pinch-off voltage that is equal to or below the amplitude of the supply level of the supply voltage Vcc at which the start-up circuit 3 is to be deactivated. In this way it is ensured that the start-up circuit 3 can be deactivated when the supply voltage Vcc reaches the supply level.

Optionally the start-up circuit 3 includes a current limiting unit 37 connected in series with the load path of the start-up transistor 30. The current limiting unit 37 is configured to limit a charging current flowing into the charge storage arrangement C to a given upper value. Providing such current limiting units 37 is particularly useful in those cases in which there is a high load supply voltage V+ that—without the current limiting unit 37—would result in high charging currents when the start-up circuit 3 is activated.

Figure 4:
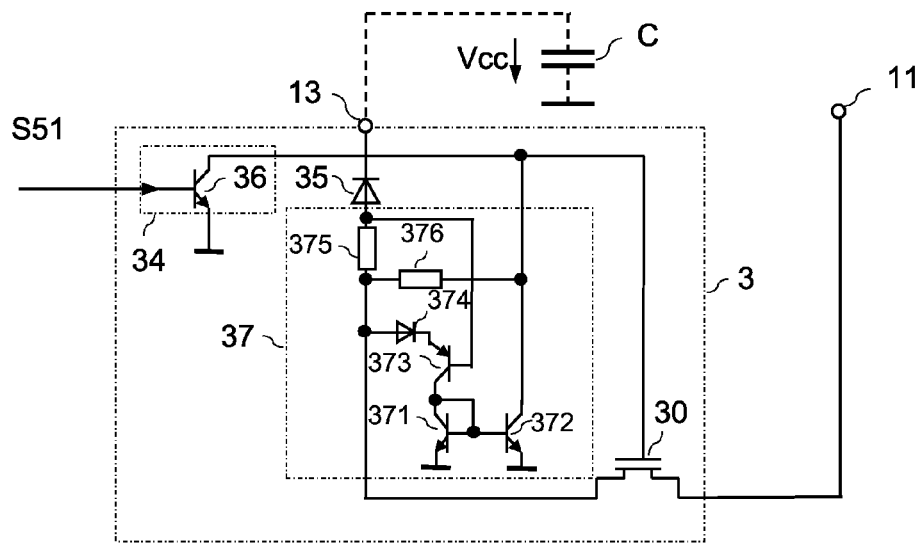
FIG. 4 illustrates an embodiment of a start-up circuit which includes a current-limiting circuit.

An embodiment of the current limiting circuit 37 is illustrated in FIG. 4. This current limiting circuit 37 has a resistor 375 connected in series with the load path of the start-up transistor 30. A charging current flowing through this resistor 375 causes a voltage drop across this resistor 375, wherein this voltage drop controls a first transistor 373. In the embodiment illustrated in FIG. 4 this first transistor 373 is a bipolar PNP transistor. This transistor has its base terminal and emitter terminal connected to the resistor 375 such that with increasing voltage drop across the resistor 375 the first transistor 373 increasingly conducts. Optionally, a rectifier element 374 like a diode, is connected between the resistor 375 and the emitter terminal of the first transistor 373. The first transistor 373 is connected in series with a second transistor 371 that is connected as a diode. When the first transistor 373 conducts, a part of the charging current flowing through the start-up transistor 30 is bypassed to the second supply potential GND to which the second transistor 371 is connected. Further, the second transistor 371 forms a current mirror together with a third transistor 372, wherein the third transistor 372 has its load path connected between the control terminal 31 of the start-up transistor 30 and the second supply potential GND. The second and third transistors 371, 372 are NPN bipolar transistors in the present example. A further resistor 376 is connected between the source terminal and the gate terminal of the start-up transistor 30. This resistor 376 provides a load current for transistor 372 of the current mirror 371, 372. The first resistor 375 and the first, the second and the third transistors 373, 371, 372 and the further resistor 376 act as a control loop that adjust the operation point of the start-up transistor 30 such that the voltage drop across the first resistor 375 and, therefore, the charging current, is limited to a given value.

Referring to FIG. 3, the evaluation circuit 44 includes a resistor 46 connected in series with the load path of the current sense transistor 40. A voltage drop across this resistor 46 corresponds to the current sense signal S4 in the present embodiment. Further, an activation transistor 45 is connected in series with the load path of the current sense transistor 40 and the resistor 46. This activation transistor 45 which is implemented as a MOSFET in the present embodiment, receives the activation signal S52. The current sense circuit 4 is activated, when the activation signal S52 has an activation level that switches the activation transistor 45 on.

Figure 5:
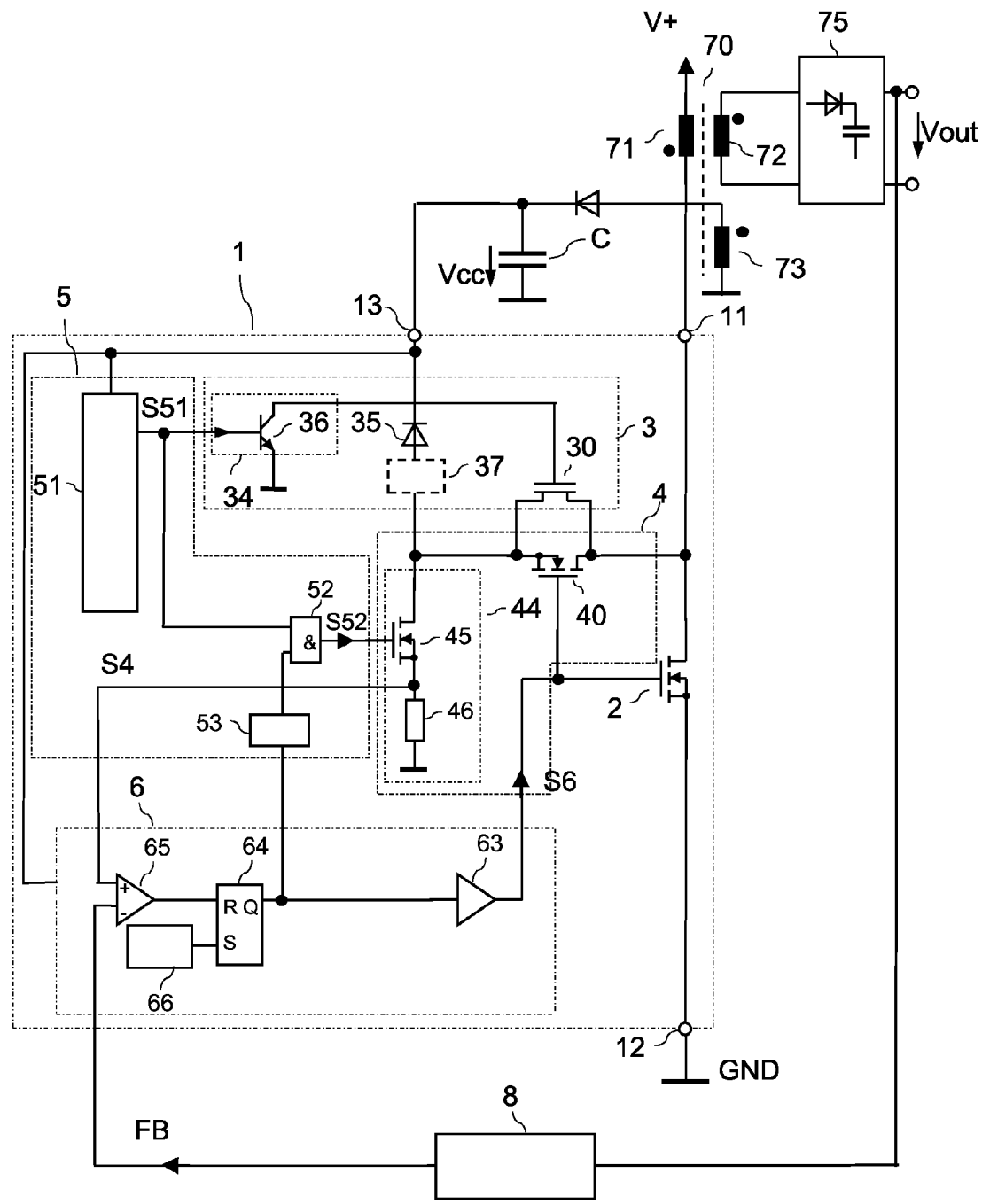
FIG. 5 illustrates an embodiment of a switched-mode power supply including an electronic circuit with a load transistor, a start-up circuit and a current sense circuit.

The electronic circuit 1 explained hereinbefore can be used for switching any kind of electric loads. FIG. 5 illustrates the use of such electronic circuit 1 in a switched-mode power supply. In this embodiment the load connected in series with the load path 11-12 of the electronic circuit 1 is a primary winding 71 of a transformer 70. The transformer 70 includes a secondary winding 72 which is inductively coupled with the primary winding 71. A rectifier circuit 75 is connected to the secondary winding 72 and includes output terminals for providing an output voltage Vout. This type of topology with a transformer 70 having a primary winding 71 and a secondary winding 72 and a rectifier circuit 75 connected to the secondary winding 72 is referred to as flyback-converter topology. This topology is generally known, so that no further explanations are required in this regard.

The drive circuit 6 includes a pulse-width modulator (PWM) which—when the drive circuit 6 is activated—provides a pulse-width-modulated drive signal S6 that switches the load transistor 2 on and off in a pulsewidth-modulated fashion. In this way the load transistor 2 generates a pulse-width-modulated voltage across the primary winding 71. This pulse-width-modulated voltage is rectified by the circuit with the primary winding 71, the secondary winding 72 and the rectifier circuit 75 into a DC output voltage Vout. The amplitude of the output voltage Vout can be regulated through the duty-cycle of the pulsewidth-modulated drive signal S6.

For generating the pulsewidth-modulated drive signal S6 the drive circuit 6 receives the current sense signal S4 and a feedback signal FB. The feedback signal FB is provided by a feedback circuit 8 that receives the output voltage Vout. The feedback signal FB is dependent on the output voltage Vout, but is not necessarily proportional to the output voltage Vout. The feedback circuit 8 may include a filter, like a proportional controller (P controller), an integral controller (I controller) or a PI controller. In the embodiment illustrated in FIG. 5 the pulse-width-modulated drive signal S6 regularly assumes an on-level in order to switch the load transistor 2 on, and assumes an off-level in order to switch the load transistor off when the current sense signal S4 reaches the feedback signal FB. For this, the drive circuit 6 includes a flip-flop 64, a comparator 65 and an oscillator 66. The oscillator 66 generates an oscillating signal received at a set-input S of the flip-flop 64, wherein the drive signal S6 assumes an on-level each time flip-flop 64 is set through the oscillator 66. The drive circuit S6 is available at an output of a driver 63 connected to an output (non-inverting output Q) of the flip-flop 64. The comparator 65 compares the current sense signal S4 with the feedback signal FB and provides an output signal that is received at a reset-input R of the flip-flop 64. The comparator output signal resets the flip-flop 64 each time the current sense signal S4 reaches the feedback signal FB, so that the drive signal S6 assumes an off-level.

As already explained hereinbefore, the drive circuit 6 receives the supply voltage Vcc available at the supply terminal 13. This is only schematically illustrated in FIG. 5. The drive circuit 6 starts to operate when the oscillator 66 starts to operate. This oscillator 66 can be adapted to start operation only then, when the supply voltage Vcc reaches the supply level. Optionally, the oscillator signal 66 is only activated when the start-up circuit 3 is deactivated. For this purpose, the deactivation signal S51, or another signal indicating the activation state of the start-up circuit 3, can be provided to the oscillator 66.

Optionally, the current sense circuit 4 is not only activated dependent on the supply voltage Vcc, but is also activated dependent on the drive signal S6. According to an embodiment the current sense circuit 4 is activated only when the supply voltage Vcc has the supply level and when the drive signal S6 has its on-level. An embodiment of a control circuit 5 activating the current sense circuit 4 in this way is illustrated in FIG. 5. This control circuit 5 includes an evaluation circuit 51 that receives the supply voltage Vcc and that generates the deactivation signal S51. Here, this deactivation signal S51 is also used for activating the current sense circuit 4, wherein the activation signal S52 received by the activation transistor 45 is generated from the deactivation signal S51 and the output signal of the flip-flop 64 by a logic gate, like an AND gate 52. AND gate 52 generates an activation level of the activation signal S52 only when the deactivation signal S51 has a deactivation level, which indicates that the start-up circuit 3 is to be deactivated, and when the drive signal S6 has an on-level, which indicates that the load transistor 2 is to be switched on. Optionally, a leading edge blanking circuit 53 is connected between the flip-flop 64 and the logic gate 52. This circuit 53 delays raising edges of the flip-flop output signal 64, so that the current sense circuit 4 is activated after a delay time after the drive signal S6 assumes its on-level.

The switched-mode power supply illustrated in FIG. 5 includes a charging circuit that is configured to charge the charge storage arrangement C when the load transistor 2 is cyclically switched on and off. This charging circuit includes an auxiliary winding 73 that is inductively coupled with the primary winding 71 of the transformer 70, and a rectifier element 74, like a diode. The auxiliary winding 73 is connected in series with the rectifier element 74, wherein the series circuit with the auxiliary winding 73 and the rectifier element 74 is connected in parallel with the charge storage arrangement C. The winding senses of the primary winding 71 and the auxiliary winding 73 are selected such that the auxiliary winding 73 transfers energy to the charge storage arrangement C each time the load transistor 2 is switched off. In this power supply the start-up circuit 3 is only used for charging the charge storage arrangement C at the beginning, i.e. when the load supply voltage V+ is switched on for the first time. During operation of the power supply, i.e. when the load transistor 2 is cyclically switched on and off, recharging of the charge storage arrangement C is performed through the further charging circuit 73, 74.

According to an embodiment the load transistor 2, the start-up transistor 30 and the current sense transistor 40 are integrated in a common semiconductor body. The specific interconnection of these transistors illustrated hereinbefore, wherein the load path of the start-up transistor 30 and the current sense transistor 40 are connected in parallel, the gate terminals of the load transistor 2 and the current sense transistor 40 are connected with each other, and wherein these transistors have a common first load terminal, makes it easy to integrate these transistors in one semiconductor body.

Figure 6:
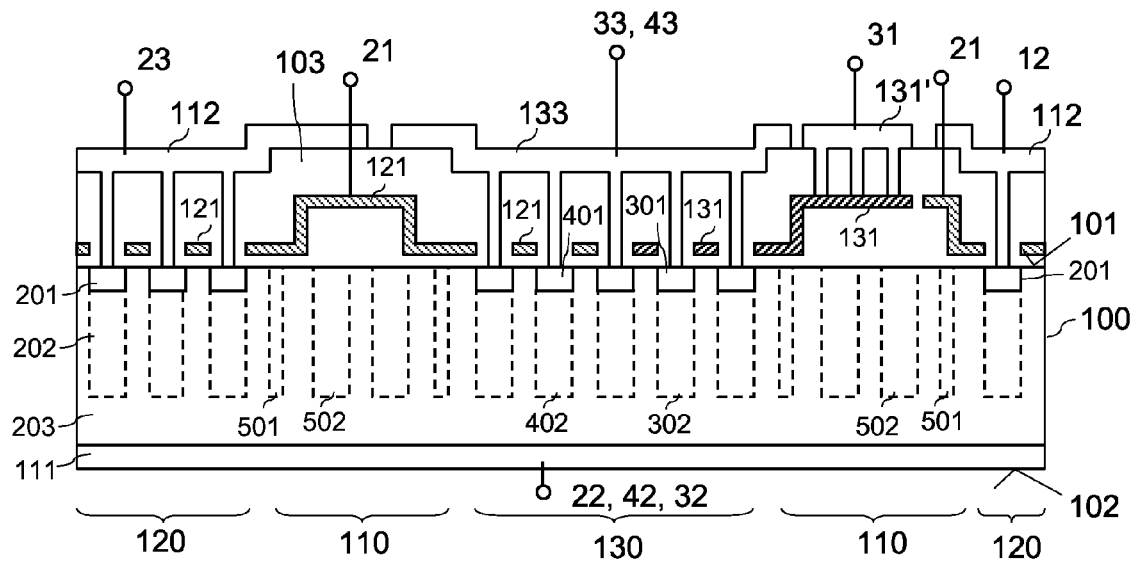
FIG. 6 schematically illustrates a vertical cross section through a semiconductor arrangement with a semiconductor body in which active regions of a first, a second and a third transistor are integrated.

FIG. 6 schematically illustrates a cross section through a part of a semiconductor arrangement with a semiconductor body 100 in which doped semiconductor regions of a first transistor, like the load transistor 2, a second transistor, like the current sense transistor 40, and a third transistor, like the start-up transistor 30, are integrated. The semiconductor body 100 includes a first surface 101, and a second surface 102 opposite to the first surface 101. FIG. 6 illustrates a cross section through the semiconductor arrangement in a vertical section plane that is perpendicular to the first and second surfaces 101, 102.

The semiconductor body 100 includes a first active region 120, a second active region 130 and an isolation region 110 arranged between the first and the second active regions 120, 130. The isolation region 110 is arranged between the first active region 120 and the second active region 130 in a horizontal direction of the semiconductor body 100. The isolation region 110 can completely surround the second active region 130. This will be explained in more detail herein further below. In the first active region at least one body region 201 and at least one source region of the first transistor is integrated. The source region is arranged within the body region 201 and is not explicitly illustrated in FIG. 6. In the second active region 130 at least one body region 401 and at least one source region of the second transistor and at least one body region 301 and at least one source region of the third transistor are arranged. In FIG. 6 only the body regions 401, 301 of the second and third transistors, but not the source regions, that are arranged within the body regions, are illustrated.

The at least one body region 201 and the at least one source region of the first transistor is electrically contacted by a first source electrode 112 that forms the second load terminal 23 of the first transistor 2. The at least one body region 401 and the at least one source region of the second transistor and the at least one body region 301 and the at least one source region of the third transistor are electrically contacted by a second source electrode 133 which forms the first load terminals 43, 33 of the second and third transistors 40, 30.

Referring to the embodiment illustrated in FIG. 6, the first transistor, the second transistor and the third transistors have a cellular structure, i.e. they have a plurality of transistor cells, with each transistor cell including a body region, such as body regions 201, 401, 301 illustrated in FIG. 6, and source regions (not illustrated) arranged within the body region. The body regions 201, 401, 301 and the source regions of the plurality of transistor cells of the first transistor are connected to the first source electrode 112, and the plurality of body regions and source regions of the transistor cells of the second and third transistors are connected to the second source electrode 133.

The transistor cells of the first transistor and the second transistor have a common first gate electrode 121 that forms the gate terminals 21, 41 of the first and second transistors. In the embodiment illustrated in FIG. 6 the first gate electrode 121 is a planar electrode which is arranged above the first surface 101 of the semiconductor body 100. The first gate electrode 121 has contact openings through which contact fingers of the first and second source electrodes 112, 133 extend to the body 201, 401 and source regions of the transistor cells. The first gate electrode 121 is dielectrically insulated from the body and source regions of the transistor cells by a gate dielectric. Further, the first gate electrode 121 is dielectrically insulated from the first and second source electrodes 112, 133 by a dielectric layer. The gate dielectric and the dielectric layer insulating the gate electrode from the source electrode are schematically illustrated as one dielectric layer 103 in FIG. 6. It goes without saying that the gate dielectric and the dielectric material insulating the source electrode from the gate electrode can be different dielectric material.

Above the isolation region 110 the first gate electrode 121 acts as a field plate and is arranged more distant to the first surface 101 of the semiconductor body than above the first and second active regions 120, 130. The isolation region 110 is free of body and source regions and has no contact fingers extending through the first gate electrode 121 down to the semiconductor body 100. The width of the isolation region 110 is, for example, in the range of between 5 times to 50 times the width of a transistor cell, and in particular between 15 times to 40 times the width of a transistor cell. In the embodiment of FIG. 6, the width of a transistor cell is defined by the centre-to-centre distance of two adjacent body regions 201 or 301. In absolute terms the width of the isolation region 110 is, for example, in the range of between 100 µm and 200 µm.

The transistor cells of the third transistor have a common second gate electrode 131 which is also a planar electrode in the embodiment illustrated in FIG. 6. The second gate electrode is dielectrically insulated from the first gate electrode 121 and has contact holes through which contact fingers of the second source electrode 133 extend to the source and body 301 regions of the transistor cells of the third transistor. The second gate electrode 131 has a gate pad 131'. In the embodiment illustrated in FIG. 6, the gate pad 131' is arranged above the isolation region 110 which electrically contacts the second gate electrode 131 above the isolation region 110. However, this is only an example. The gate pad 131' could also be arranged at any other suitable position. The gate pad 131' could, for example, be arranged somewhere above the source electrode 133 and electrically insulated from the source electrode 133, wherein in this case the source electrode 133 includes openings through which the contact fingers of the gate pad 131' extend to the gate electrode 131.

The first gate electrode 121 also includes a gate pad. However, this gate pad is not illustrated in the cross section shown in FIG. 6. Above the isolation region 110 the second gate electrode 131 has electrode sections that are arranged more distant to the first surface 101 of the semiconductor body than above the second active region 130.

Implementing the transistor cells as planar transistor cells is only an example. Other types of transistor cells, such as trench transistor cells instead of planar transistor cells, may be used as well.

The first transistor, the second transistor and the third transistor have a common drift region 203 in which the body 201, 401, 301 and source regions of the first, the second and the third transistor are arranged. A drain region 111 adjoins the drift region 203 in the vertical direction of the semiconductor body 100. The drain region 110 or a drain electrode (not illustrated) contacting the drain region 111 form the common first load terminal 22, 42, 32 of the three transistors. The three transistors may be implemented as n-type transistors. In this case the drift region 203, the drain region 111 and the source regions are n-doped, while the body regions are p-doped. The three transistors could also be implemented as p-type transistors. In this case the drift region 203, the drain region 111 and the source regions are p-doped, while the body region 201, 401, 301 are n-doped.

The three transistors implemented in the semiconductor body 100 are vertical transistors, i.e. a load current flowing through the transistors flows in a vertical direction of the semiconductor body 100. The three transistors have identical or at least similar voltage blocking capabilities.

Optionally the transistors are implemented as super-junction transistors. In this case a plurality of compensation regions are arranged in the drift region 203. In the first and second active regions 120, 130 these compensation regions 202, 402, 302 are connected to the body region of the first, the second or the third transistor. Optionally, compensation regions are also arranged in the isolation region 110, wherein the compensation regions arranged in the isolation region 110 are floating regions, i.e. are not connected to one of the source or gate electrodes. In the isolation regions 110 different compensation zones may be arranged: a first type of compensation zones 501 that have smaller horizontal dimensions than the compensation zones in the first and second active regions 120, 130; and a second type of compensation zones 502 that have the dimensions of the compensation zones in the first and second active regions 120, 130. The compensation zones 501, 502 in the isolation region are arranged distant to one another in the horizontal direction. The dimension of the first type of compensation zones 501 in a lateral direction is, for example, half the dimension of the second type of compensation zones 502.

The isolation region 110 acts as an edge termination for the first transistor integrated in the first active region 120 and the second and third transistors integrated in the second active region 130. The isolation region 110 allows to switch on the first transistor 2 and one of the second and third transistors 40, 30 independently. In particular, the isolation region prevents a parasitic current to flow between the individual transistors within the semiconductor current, like between the first transistor and the second transistor. In case the second transistor is implemented as a current measurement transistor, such parasitic current would negatively influence a measurement current provided by the second transistor.

The risk of such parasitic currents to flow between the first and second transistor or the first and third transistor is, in particular, present in those arrangements which include transistors with compensation regions, such as regions 302, 402, 502 illustrated in FIG. 6, arranged in their drift zones. The dimension of the isolation region 110 explained hereinabove applies to such arrangements with compensation regions. In transistor arrangements with a first, a second and a third transistor which do not include compensation regions, a narrower isolation region 110 can provided which has only a width of several times, like 2 to 7 times, the width of a transistor cell.

Figure 7:
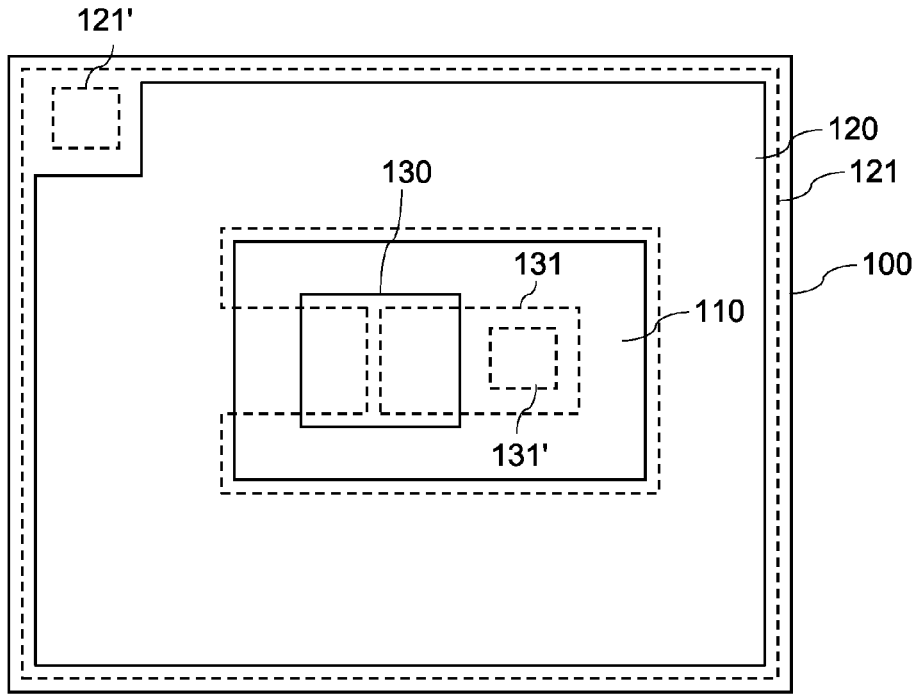
FIG. 7 illustrates a horizontal cross section through the semiconductor body of FIG. 6.

FIG. 7 schematically illustrates a top view on the first surface 101 of the semiconductor body. FIG. 7 shows the overall semiconductor body 100. In FIG. 7 only the first and the second active regions 120, 130 and the isolation region 110 are schematically illustrated, individual transistor cells are not shown. In the embodiment illustrated in FIG. 7 the first active region 120 completely surrounds the second active region 130, separated by the isolation region 110. In dashed lines the first and second gate electrodes 121, 131 are also illustrated. The first gate electrode 121 has a gate pad 121' that may be arranged in a corner of the semiconductor body.

Figure 8:
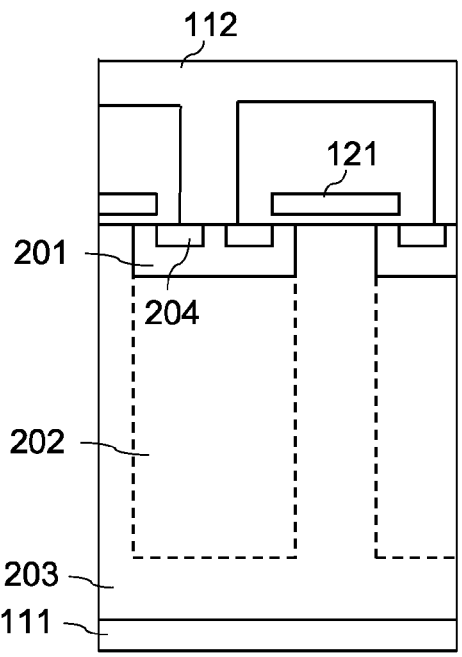
FIG. 8 illustrates a vertical cross section through transistor cells of the first transistor.

FIG. 8 schematically illustrates a cross section through one transistor cell of the first transistor. The transistor cell includes the body region 201 and a source region 204 arranged within the body region 201. The transistor cell is a planar transistor cell, i.e. the first gate electrode 121 is arranged above the first surface 101 of the semiconductor body. Sections of the drift region 201 extend to the first surface 101 of the semiconductor body. The gate electrode 121 in a horizontal or lateral direction extends from the source region 204 to the drift region 203. A source finger of the first source electrode 112 electrically contacts both the body region 201 and the source region 204. The transistor cell illustrated in FIG. 8 is the transistor cell of an enhancement MOSFET. In this case the source region 204 is completely separated from the drift region 203 by the body region 201. The transistor cells of the second transistor correspond to the transistor cell illustrated in FIG. 8 of the first transistor.

Figure 9:
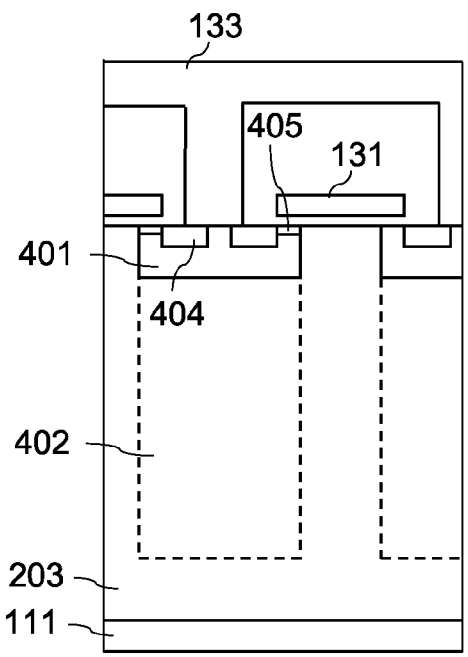
FIG. 9 illustrates a vertical cross section through transistor cells of the third transistor.

FIG. 9 illustrates a cross section through a transistor cell of the third transistor. This transistor cell basically corresponds to the transistor cells of the first and second transistors with the difference that between a source region 404 which is arranged within the body region 401 and the drift region 203 there is a channel region 405 of the same doping type as the source region 404 which extends between the source region and the drift region 203 below the second gate electrode 131. This channel region 405 provides a conducting channel between the source region 404 and the drift region 203 when a control voltage supply between the second gate electrode 131 and the second source electrode 133 is zero. The transistor cell is, therefore, a depletion-type transistor cell which is switched off when a negative gate-source voltage is applied in case of an n-type depletion MOSFET, and a positive gate-source voltage is applied in case of a p-type MOSFET.

Figure 10:
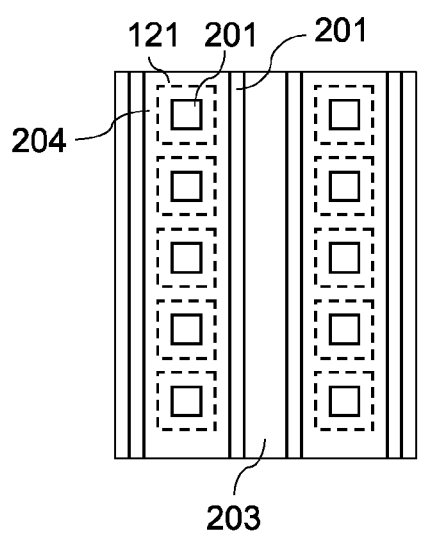
FIG. 10 schematically illustrates a horizontal cross section through a semiconductor in which strip-shaped transistor cells are integrated.
Figure 11:
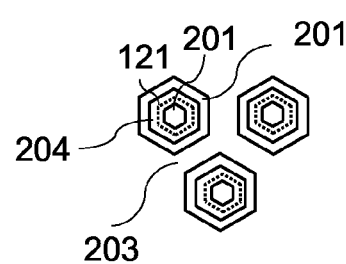
FIG. 11 schematically illustrates a horizontal cross section through a semiconductor in which strip-shaped transistor cells are integrated.

Generally, the different transistor cells can have any kind of cell geometry. FIG. 10 schematically illustrates a top view on transistor cells of the first transistor having a stripe geometry. The geometry of the transistor cell is basically defined by the geometry of the body regions 201. Stripe transistor cells have stripe-shaped body regions. Of course, any other type of cell geometry may be applied as well, such as hexagonal cells (see FIG. 11), rectangular cells or others.

Figure 12A:
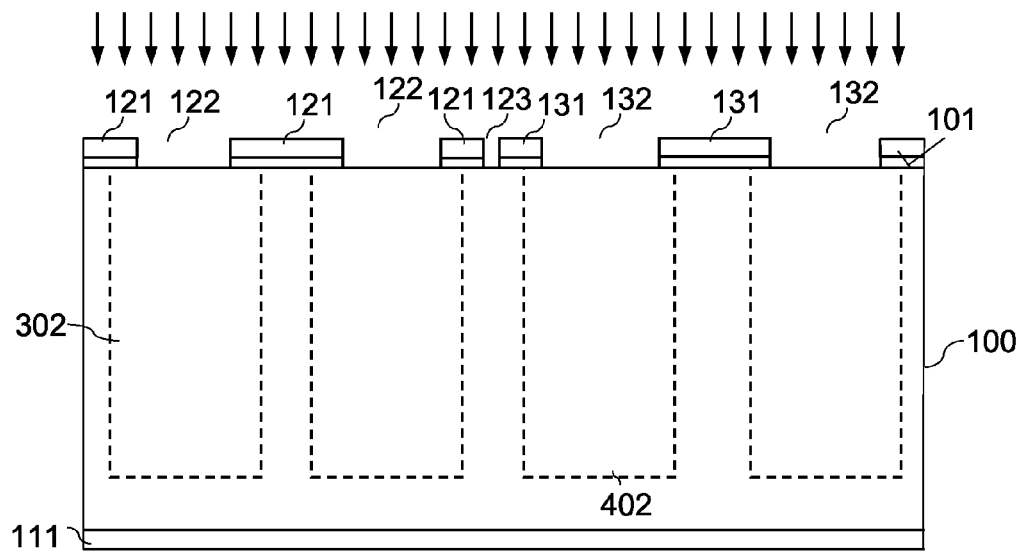
FIG. 12 that includes FIGS. 12A to 12C schematically illustrates a method for producing transistor cells of the second transistor and the third transistor.
Figure 12B:
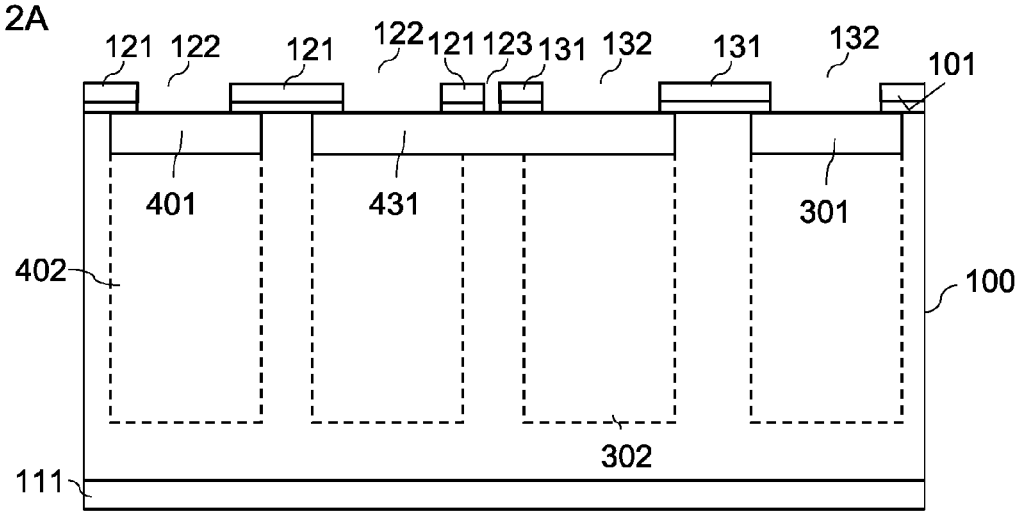
Figure 12C:
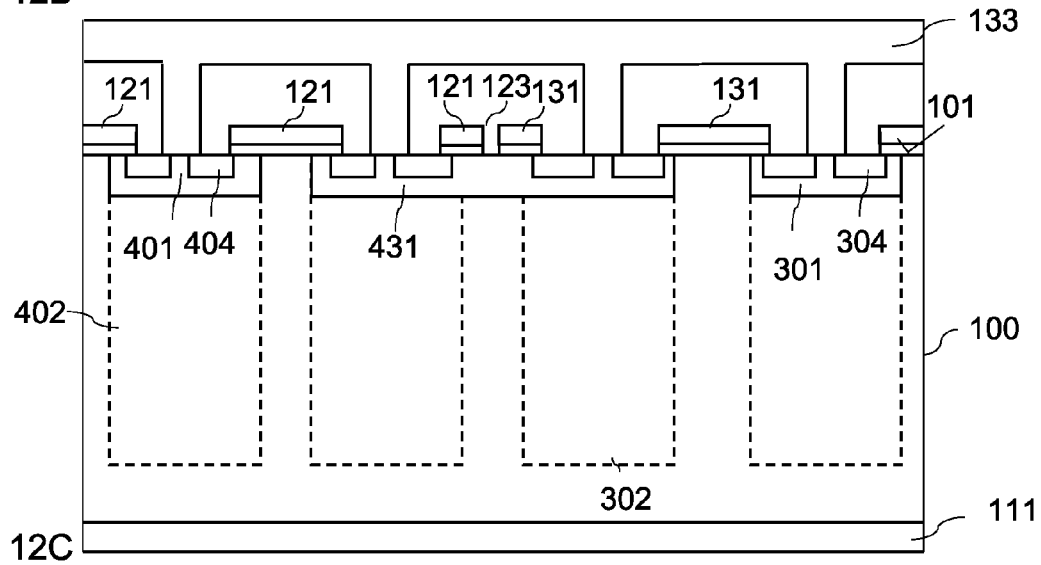

FIGS. 12A to 12C schematically illustrate a method for producing transistor cells of the second and third transistors in the second active region 130 of the semiconductor body 100. FIG. 12A shows a vertical cross section through the semiconductor body 100 after the first and second gate electrodes 121, 131 were produced above the semiconductor body 100. These gate electrodes are dielectrically insulated from the semiconductor body 100 by gate dielectrics. In the lateral direction of the semiconductor body 100 first and second gate electrodes 121, 131 are separated from one another by a gap 123. The first and second gate electrodes 121, 131 have contact holes 122, 132 through which contact fingers of the second source electrode 133 extend to the first surface or into the first surface 101 of the semiconductor body 100 when the component has been completed.

Using the first and second gate electrodes 121, 131 with the contact holes 122, 132 as mask dopants are implanted or diffused into the semiconductor body. Dopants that are implanted through the contact holes 122 of the first gate electrode 121, referring to FIG. 12B, form body regions 401 of the second transistor, while dopants implanted or diffused through contact holes 132 of the second gate electrode 131 form body regions 301 of the third transistor. Dopants are not only implanted through the contact holes 122, 132 of the first and second gate electrodes 121, 131 but also through the gap 123 between these gate electrodes 121, 131.

Implanting or diffusing the dopants into the semiconductor body 100 involves a temperature process that causes the dopants to diffuse in a lateral direction below the gate electrodes 121, 131. The dopants that are implanted in the region of the gap 123 "connect" two adjacent doped regions that were produced by implanting dopants through contact holes 122, 132 of the first and second gate electrodes 121, 131. This results in a body region 206 extending from a contact hole 122 of the first gate electrode 121 to a contact hole 132 of the second gate electrode 131.

Referring to FIG. 12C the transistor cells are completed by generating the source regions 404, 304 of the second and third transistors, and the second source electrode 133 with the contact fingers extending to the body and source regions of the transistor cells of the second and third transistors. In this component a transistor cell of the second transistor and a transistor cell of the third transistor have a common body region, namely body region 431 that is arranged below the gap 123 and below a contact hole of the first gate electrode and a contact hole of a second gate electrode. Thus, below the gap 123 between the first and second source electrodes 121, 131 no conducting channel between the source region 304 of the second transistor or the source regions 404 of the third transistor and the drift region 203 can be generated.

In the embodiment illustrated in FIG. 6, the first and the second transistors have a common gate electrode. However, this is only an example. The gate electrode 121 could also be separated in two pieces, a first piece above the first active region, and a second piece above the second active region. In this case the first and the second transistor can be controlled independently of one another.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor arrangement, comprising:
a semiconductor body with a first active region, a second active region and an isolation region arranged between the first and the second active regions;
at least one source region and at least one body region of a first transistor integrated in the first active region;
at least one source region and at least one body region of a second transistor integrated in the second active region; and
source and body regions of a third transistor integrated in the second active region;
wherein the second transistor and the third transistor have a common source electrode;
wherein the first transistor, the second transistor and the third transistor have a common drain electrode,
wherein the isolation region is configured to act as an edge termination for the first transistor integrated in the first active region and the second and third transistors integrated in the second active region so that the first transistor and one of the second and third transistors can switch on independently.

2. The semiconductor arrangement of claim 1, wherein the first transistor and the second transistor have a common first gate electrode.

3. The semiconductor arrangement of claim 1, wherein the first transistor, the second transistor and the third transistor each comprise a plurality of transistor cells, each transistor cell including a body region and a source region.

4. The semiconductor arrangement of claim 3, wherein at least one transistor cell of the second transistor and at least one transistor cell of the third transistor cell have a common body region.

5. The semiconductor arrangement of claim 1, further comprising a plurality of floating compensation regions arranged in the isolation region.

6. The semiconductor arrangement of claim 1, wherein a width of the isolation region is in a range of between 5 times to 50 times a width of a transistor cell arranged in the first or the second active region.

7. The semiconductor arrangement of claim 2, wherein the isolation region has no contact fingers extending from the common first gate electrode to the semiconductor body, and wherein the common first gate electrode is arranged more distant to the semiconductor body above the isolation region than above the first and the second active regions.

8. A semiconductor arrangement, comprising:
a semiconductor body with a first active region, a second active region and an isolation region arranged between the first and the second active regions;
at least one source region and at least one body region of a first transistor integrated in the first active region;
at least one source region and at least one body region of a second transistor integrated in the second active region;
source and body regions of a third transistor integrated in the second active region;
wherein the second transistor and the third transistor have a common source electrode;
wherein the first transistor, the second transistor and the third transistor have a common drain electrode,
wherein the isolation region is free of body and source regions.

9. The semiconductor arrangement of claim 8, wherein the first transistor and the second transistor have a common first gate electrode.

10. The semiconductor arrangement of claim 9, wherein the isolation region has no contact fingers extending from the common first gate electrode to the semiconductor body, and wherein the common first gate electrode is arranged more distant to the semiconductor body above the isolation region than above the first and second active regions.

11. The semiconductor arrangement of claim 8, further comprising a plurality of compensation regions arranged in a drift region of the first and the second active regions.

12. The semiconductor arrangement of claim 11, further comprising a plurality of floating compensation regions arranged in the isolation region.

13. The semiconductor arrangement of claim 8, wherein a width of the isolation region is in a range of between 5 times to 50 times a width of a transistor cell arranged in the first or the second active region.

14. The semiconductor arrangement of claim 1, further comprising a plurality of compensation regions arranged in a drift region of the first and the second active regions and in the isolation region.

15. The semiconductor arrangement of claim 8, further comprising a plurality of compensation regions arranged in a drift region of the first and the second active regions and in the isolation region.

* * * * *